United States Patent
Moteki et al.

(10) Patent No.: US 6,334,084 B1
(45) Date of Patent: Dec. 25, 2001

(54) FAIL-SAFE APPARATUS AND FAIL-SAFE METHOD FOR ELECTRONIC CONTROL SYSTEM

(75) Inventors: Norio Moteki; Kenichi Machida, both of Atsugi (JP)

(73) Assignee: Unisia Jecs Corporation, Kanagawa-Ken (JP)

( * ) Notice: Subject to any disclaimer, the term of this patent is extended or adjusted under 35 U.S.C. 154(b) by 0 days.

(21) Appl. No.: 09/577,966

(22) Filed: May 25, 2000

(30) Foreign Application Priority Data

May 28, 1999 (JP) .................................................. 11-149221

(51) Int. Cl.[7] ............................. F02D 41/22; G06F 11/16
(52) U.S. Cl. ............................................. 701/114; 700/79
(58) Field of Search .............................. 700/79–82; 714/5, 714/9, 47; 701/114

(56) References Cited

FOREIGN PATENT DOCUMENTS

| 9-287494 | 11/1997 | (JP) . |
| 2000-76142-A | * 3/2000 | (JP) ................................ G06F/12/16 |

* cited by examiner

*Primary Examiner*—Andrew M. Dolinar
(74) *Attorney, Agent, or Firm*—McDermott, Will & Emery

(57) ABSTRACT

Duplex fail-safe systems are equipped for outputting fail-safe control signals when a failure is determined by a read/write diagnosis of a RAM, and the logic for the logic operation performed by one of said systems is set to be reverse to the logic for the logic operation performed by the other system.

15 Claims, 4 Drawing Sheets

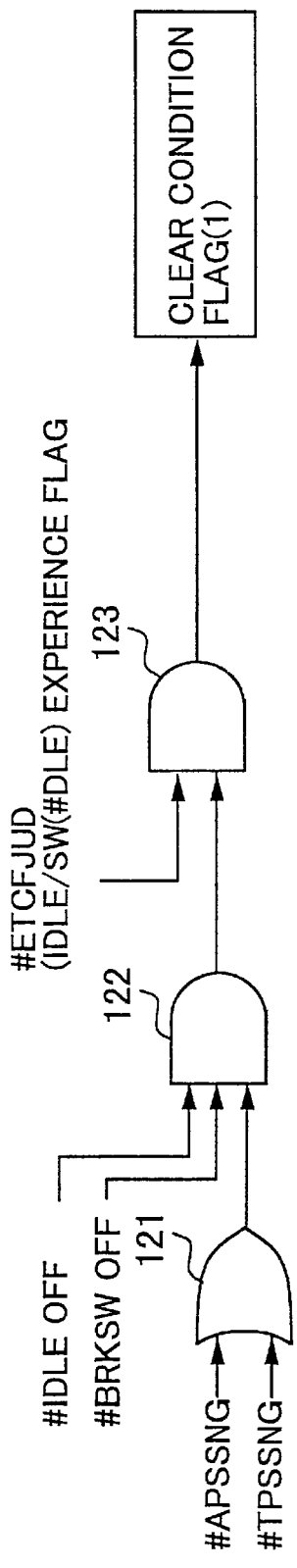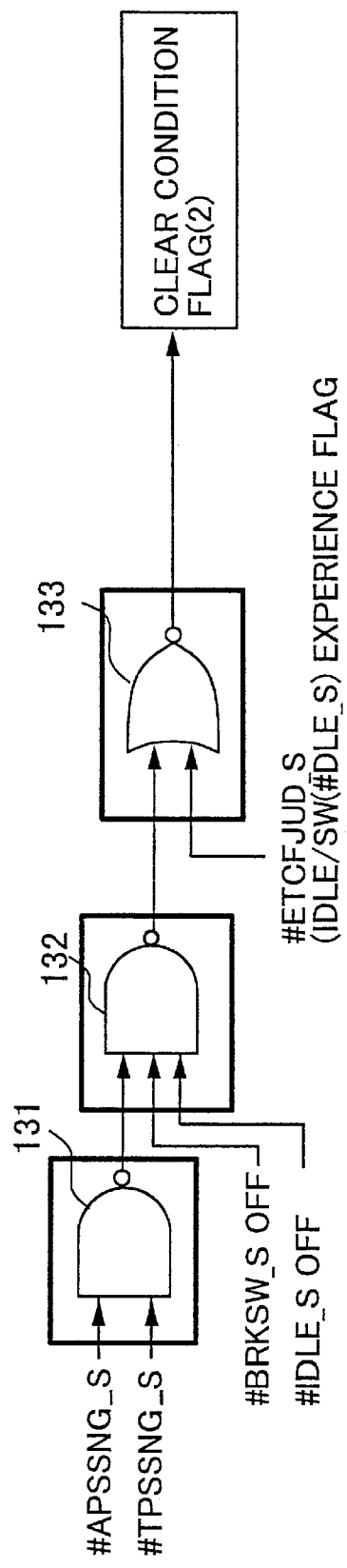

FAIL-SAFE APPARATUS AND FAIL-SAFE METHOD FOR ELECTRONIC CONTROL SYSTEM

FIELD OF THE INVENTION

The present invention relates to a fail-safe apparatus and a fail-safe method for an electronic control system, and particularly, to a fail-safe technique for an electronic control system of an automotive engine.

DESCRIPTION OF THE RELATED ART

Heretofore, there has been known an electronic controlled throttle valve for an automotive engine, comprising an actuator such as a motor for open/close driving a throttle valve, in which the actuator is controlled by a microcomputer (Japanese Unexamined Patent Publication No. 9-287494).

Moreover, in the above-mentioned electronic controlled throttle valve, the reading/writing of the RAM used for control is diagnosed, and when read/write error occurs, the procedure is shifted to a fail-safe control. Further, the fail-safe control system may be duplexed, and the diagnosis result may be processed by each of the duplex systems, so that a fail-safe control signal would be output when at least one of the two fail-safe control systems is operating normally.

However, if the read/write error is caused by a failure of bit line or word line, the RAM region with which the fail-safe control is performed (for example, the region storing a flag showing the diagnosis result or the fail-safe request) may also become abnormal, and the transition to the fail-safe control procedure may not be carried out properly.

In other words, the conventional fail-safe apparatus is equipped with duplex systems having the same logic construction. Therefore, when a failure of bit line or word line causes an error of the RAM over a wide range, so that the flags of both duplex systems are shifted to the same direction, there is a possibility that both duplex systems will be operated erroneously, and that transition to the fail-safe control procedure can not be carried out.

SUMMARY OF THE INVENTION

The present invention aims at solving the above-mentioned problems. The object of the invention is to provide a fail-safe apparatus and a fail-safe method for an electronic control system, being capable of performing a fail-safe control reliably, even when a failure occurs to a bit line or a word line of a RAM.

In order to achieve the above object, according to the present invention, the construction is such that duplex fail-safe control systems have mutually reverse logic for logic operation, and in one fail-safe control system, a fail-safe request state is denoted when the logic is 0, whereas in the other fail-safe control system, a fail-safe request state is denoted when the logic is 1.

The logic operation mentioned above includes a logic operation of a fail-safe request flag based on fault diagnosis of a control object to which a fail-safe control signal is output and a fail-safe request flag based on fault diagnosis of a diagnosis object.

Further, it is preferable to include a logic operation for clearing the fail-safe request based on the fault diagnosis. Systems for determining clear conditions may also be duplex to have logic for logic operation of the duplex systems may be mutually reverse.

Moreover, in duplex systems for outputting fail-safe requests, each of the two systems is preferably constructed to perform a logic operation of a fail-safe request of the other system and a fail-safe request of its own system.

Here, it is preferable that the diagnosis object is made a RAM used to control an electronic controlled throttle valve, and as a fail-safe control, a relay of a motor which drives the throttle valve to open/close is controlled to turn off.

These and other objects and aspects of the present invention will become apparent from the following explanations of the preferred embodiments of the invention with reference to the accompanied drawings.

BRIEF DESCRIPTION OF THE DRAWINGS

FIG. 4(A) and FIG. 4(B) are logic circuit diagrams for setting conditions to clear a fail-safe request in the second embodiment.

DETAILED DESCRIPTION OF THE PREFERRED EMBODIMENT

Figure 1:
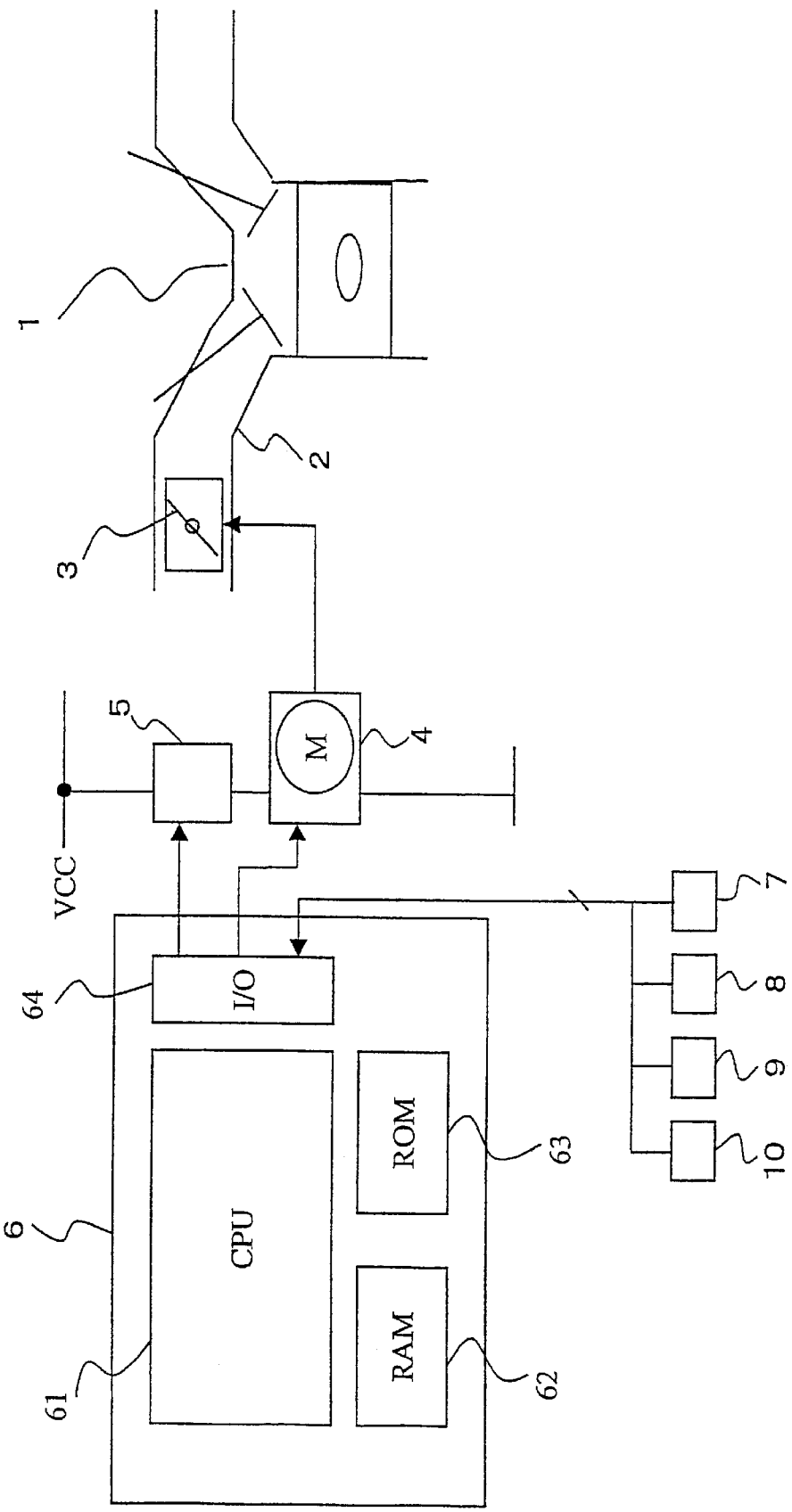
FIG. 1 shows a system configuration of an electronic controlled throttle valve system to which the present invention is applied in an embodiment.

FIG. 1 shows an electronic controlled throttle valve system for an automotive engine, which includes a microcomputer to which a fail-safe unit of an electronic control system according to the present invention is applied.

As shown in FIG. 1, a butterfly-type throttle valve 3 is mounted to an intake pipe 2 of an engine 1. An intake air quantity of the engine 1 is adjusted by an opening of the throttle valve 3.

The throttle valve 3 is driven to open/close by a motor 4. A power source VCC is connected to the motor 4 via a relay 5.

A microcomputer 6 for controlling the on/off of the relay 5 and the position (opening) of the throttle valve 3 driven by the motor 4 includes a CPU 61, a RAM 62, a ROM 63, an I/O 64 and the like.

Detection signals from an accelerator opening sensor 7, an ignition switch 8, a neutral switch 9, an engine rotation sensor 10 and the like are input to the microcomputer 6.

A target opening is determined by computing in advance data of an accelerator opening and the like according to a program stored in the ROM 63. Then, in order to drive the throttle valve 3 to the target opening, an opening control signal (particularly, a duty control signal of a power transistor that controls the power supply to the motor 4) is output to the motor 4.

Further, a read/write error of the RAM 62 utilized for computing the target opening and the like is diagnosed. When the read/write error occurs, a fail-safe process is carried out in which the relay 5 is forcibly turned off.

Figure 2:
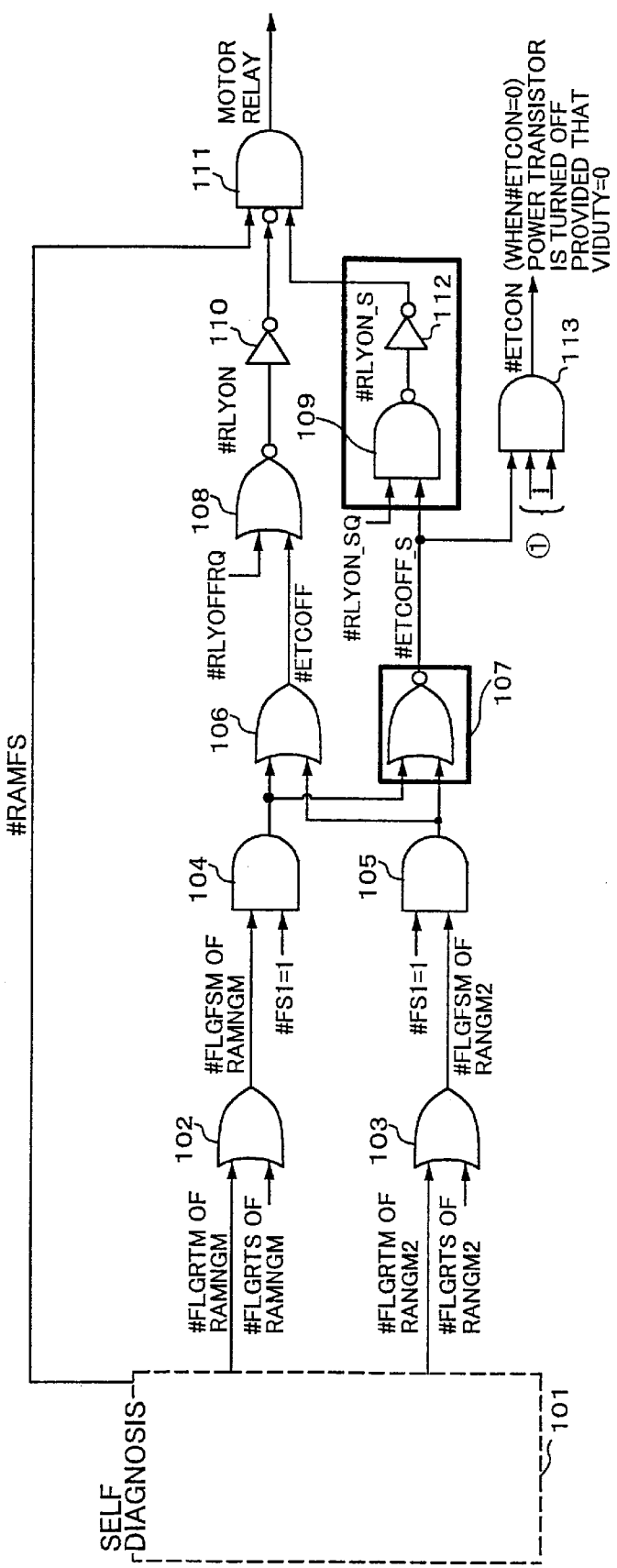
FIG. 2 is the logic circuit diagram showing a first embodiment of a fail-safe control system.

Actually, the fail-safe process is performed as shown in a logic operation circuit of FIG. 2.

A read/write diagnosis of a predetermined address in the selected RAM 62 is performed by a RAM diagnosis unit 101. The RAM diagnosis unit 101 corresponds to a fault diagnosis device and a fault diagnosis means.

In the read/write diagnosis, a reference data (for example, AAAAAAAh) is written to a diagnosis object address, and the written data is copied to a temporary region. Then, the temporary data is inverted (inverted data=55555555h), and the inverted data is stored to the diagnosis object address. The temporary data and readout data from the diagnosis object address, which should be the mutually inverted data, are compared with each other. When the two data do not correspond, a read/write error of the diagnosis object address is determined.

Further, according to the present embodiment, the on state of the ignition switch is made the conditions for performing the RAM diagnosis. The construction is such that a flag #IGNSW which is set to 1 when the ignition switch is on, and a flag #IIGNSW which is set to 1 when the ignition switch is off are set, respectively, as the conditions for performing the RAM diagnosis. When either the flag #IGNSW is 1 or the flag #IIGNSW is 0, the RAM diagnosis is performed.

According to the above-mentioned construction, even when the address of the RAM, to which the flags #IGNSW and #IIGNSW are stored, are all set to 0 or to 1 due to a word line failure or a bit line failure, the RAM diagnosis may still be performed. Since the conditions for diagnosis is determined as fulfilled by either one of the two flags.

When a read/write error is determined as a result of the above diagnosis, 1 is set to a RAM diagnosis NG flag #FLGRTM within a generic flag RAMNGM, and at the same time, 1 is set to a RAM diagnosis NG flag #FLGRTM within a generic flag RANGM2.

Hereinafter, a fail-safe process system based on the flag within the generic flag RAMNGM is called a main operation unit, and a fail-safe process system based on the flag within the generic flag RANGM2 is called a sub operation unit. In other words, the present embodiment is equipped with duplex fail-safe process systems (output systems of fail-safe control signals).

Further, the main operation unit corresponds to a first request flag operation device and a first request flag operation means, and the sub operation unit corresponds to a second request flag operation device and a second request flag operation means.

In the main operation unit, an OR operation of the RAM diagnosis NG flag #FLGRTM within the generic flag RAMNGM and a RAM diagnosis NG flag #FLGRTS within the generic flag RAMNGM is performed by an OR circuit 102.

Similarly, in the sub operation unit, an OR operation of the RAM diagnosis NG flag #FLGRTM within the generic flag RANGM2 and a RAM diagnosis NG flag #FLGRTS within the generic flag RANGM2 is performed by an OR circuit 103.

In a case that the fail-safe system is equipped with a main CPU and a sub CPU, the RAM diagnosis NG flag #FLGRTS is a flag to which the result of the read/write diagnosis of the sub CPU is set. Since the present embodiment is equipped with one CPU, the flag is set to 0 constantly. However, in an example where a main CPU and a sub CPU are equipped to the fail-safe system, the flag is set to 1 or 0 depending on the result of the read/write diagnosis of the sub CPU.

The result of the OR operation is set to a fail-safe request flag #FLGFSM within the generic flag RAMNGM in the main operation unit, and set to a fail-safe flag #FLGFSM within the generic flag RANGM2 in the sub operation unit.

The fail-safe request flags #FLGFSM for the main operation unit and the sub operation unit are performed of an AND operation at AND circuits 104 and 105, respectively, with a flag #FS1 (according to the present embodiment, #FS1=1) in the ROM, which selects whether or not to inhibit the control of the electronic controlled throttle as a fail-safe process.

An OR operation is performed by an OR circuit 106 (first OR circuit) of the main operation unit of the result of the AND operation by the AND circuit 104 of the main operation unit and the result of the AND operation by the AND circuit 105 of the sub operation unit. The result of the OR operation is set to an inhibit condition fulfil flag #ETCOFF.

Moreover, at the sub operation unit, a NOT-OR operation is performed by a NOR circuit 107 (first NOR circuit) of the result of the AND operation by the AND circuit 104 of the main operation unit and the result of the AND operation by the AND circuit 105 of the sub operation unit. The result of the NOT-OR operation is set to an inhibit condition fulfil flag #ETCOFF_S.

Next, in the main operation unit, a NOT-OR operation is performed by a NOR circuit 108 (second NOR circuit) of the inhibit condition fulfil flag #ETCOFF and a relay OFF request flag #RLYOFFRQ (=1: off request exists) based on the diagnosis result of the motor relay. The result of the NOT-OR operation is set to a motor relay control flag #RLYON (first fail-safe request flag).

Next, in the sub operation unit, a NOT-AND operation is performed by a NAND circuit 109 (first NAND circuit) of the inhibit condition fulfil flag #ETCOFF_S and a relay ON request flag #RLYON_SQ (=1: on request exists) based on the diagnosis result of the motor relay. The result of the NOT-AND operation is set to a motor relay control flag #RLYON_S (second fail-safe request flag).

The motor relay control flag #RLYON of the main operation unit is performed of a NOT operation by a NOT circuit 110, and then inverted and input to an AND circuit 111 (first AND circuit). Further, the motor relay control flag #RLYON_S of the sub operation unit is performed of a NOT operation by a NOT circuit 112, and then input to the AND circuit 111 as it is.

The AND circuit 111 corresponds to a fail-safe control device and a fail-safe control means.

Other than the above, a relay OFF flag #RAMFS (=1: time of RAM error) is input to the AND circuit 111 directly from the RAM diagnosis unit 101.

When the RAM read/write error is diagnosed and 1 is set to the RAM diagnosis NG flag #FLGRTM, 1 is set to the inhibit condition fulfil flag #ETCOFF, and at the same time, 0 is set to the inhibit condition fulfil flag #ETCOFF_S.

As a result, 0 is set to the motor relay control flag #RLYON, and at the same time, 1 is set to the motor relay control flag #RLYON_S. The output of the AND circuit 111 (fail-safe control signal) to which the motor relay control flags #RLYON and #RLYON_S are input, becomes 0 (low). The output of the AND circuit 111 is output to the motor relay which is the object of control (not shown in the drawing), and when the output of the AND circuit 111 is 0 (low), the motor relay is forcibly turned off.

The motor relay control flags #RLYON and #RLYON_S are set to have mutually reverse logic at the main operation unit and the sub operation unit. Therefore, even if, for example, a failure in the word line and/or the bit line of the RAM effects the address portion in which the inhibit condition fulfil flags #ETCOFF and #ETCOFF_S are stored, so that the flags are both set to 0 forcibly although the RAM read/write error is diagnosed, the flag #ETCOFF_S is a flag to be set to 0 at the time of the read/write error of the RAM. Therefore, even if the relay can not be turned off based on the flag #ETCOFF, the relay may still be turned off based on the flag #ETCOFF_S.

Further, in case both the inhibit condition fulfil flags #ETCOFF and #ETCOFF_S are forcibly set to 1 due to a failure in the word line and/or the bit line of the RAM, the relay may still be turned off based on the flag #ETCOFF even if the relay can not be turned off based on the flag #ETCOFF_S.

In addition, the present embodiment is equipped with an AND circuit 113 for inputting an OFF request flag (=0: time of off demand) set based on conditions such as the neutral switch, the engine rotation, the starter switch, the battery voltage, the ignition switch and so on (conditions shown as ① in the drawing), and the flag #ETCOFF_S and performing an AND operation. When an output #ETCON of the AND circuit 113 is 0, a power transistor for controlling the drive current of the motor is turned off. When a fail-safe flag ETCOFF_S is set to 0 by RAM failure, the motor relay is turned off, and the power transistor is also turned off.

Even if there is fulfilled a condition that a request to turn the relay off is output by the inhibit condition fulfil flags #ETCOFF and #ETCOFF_S, there are cases where the throttle is requested to be driven by the motor by clearing the relay off request and maintaining the on state of the motor relay. In order to correspond to such request, the fail-safe control may be performed by the logic circuit shown in FIG. 3.

Figure 3:
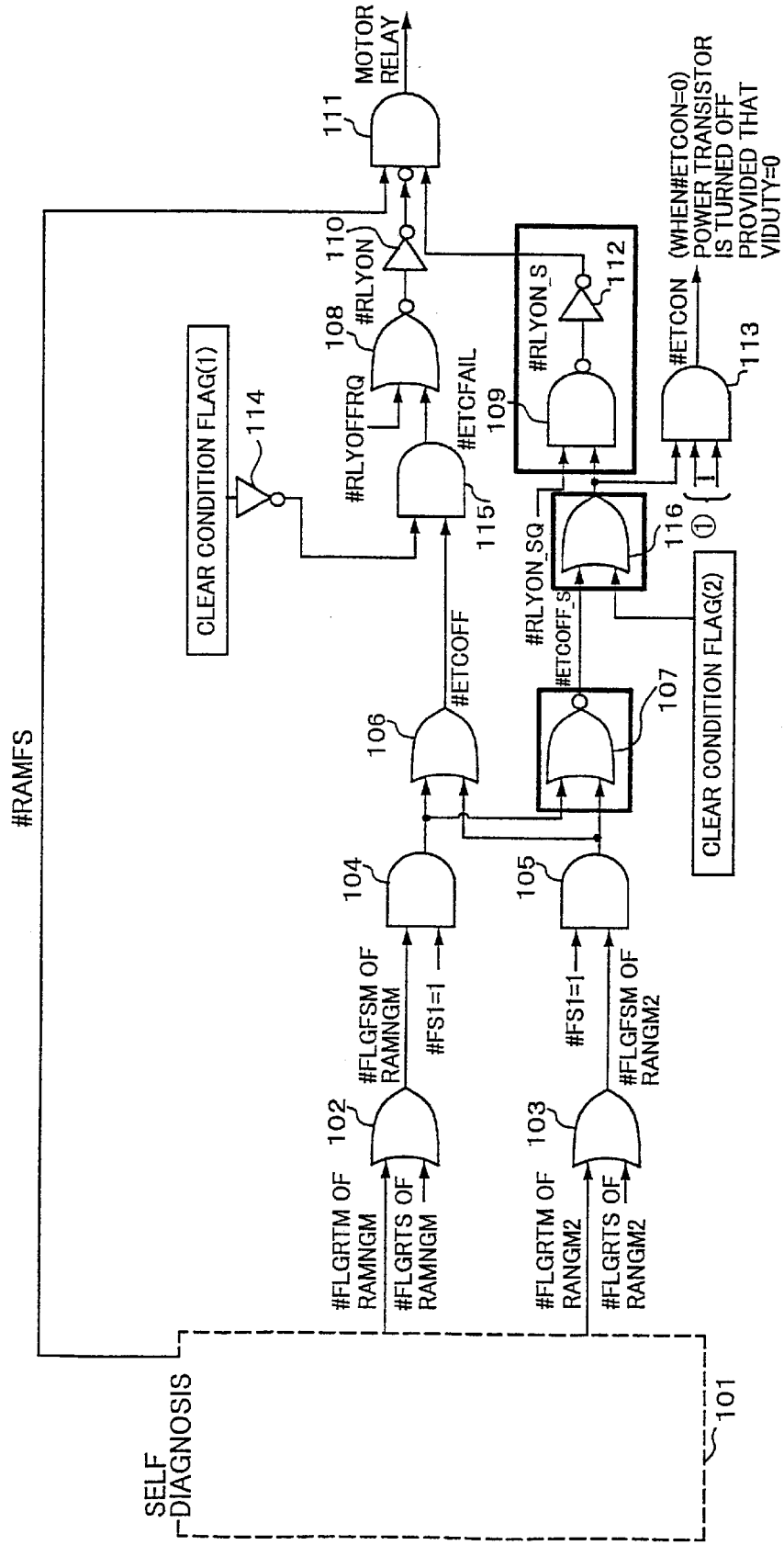
FIG. 3 is the logic circuit diagram showing a second embodiment of the fail-safe control system.

According to an embodiment shown in FIG. 3, in the main operation unit, an AND operation is performed by an AND circuit 115 (second AND circuit) of the inhibit condition fulfil flag #ETCOFF and the result of NOT operation of a clear condition flag (1) by a NOT circuit 114. The result of the AND operation is set to a fail-safe flag #ETCFAIL.

Further, in the sub operation unit, an OR operation is performed by an OR circuit 116 (second OR circuit) of the inhibit condition fulfil flag #ETCOFF_S and a clear condition flag (2). The result of the OR operation is set to a fail-safe flag #ETCFAIL_S.

Further, the clear condition flags (1) and (2) are for clearing the fail-safe request. The flags are set to 1 when the clear conditions are fulfilled.

Then, in the main operation unit, the fail-safe flag #ETCFAIL and the relay OFF request flag #RLYOFFRQ (=1: off request exists) based on the motor relay diagnosis are performed of a NOT-OR operation by the NOR circuit 108. The result of the NOT-OR operation is set to the motor relay control flag #RLYON.

In the sub operation unit, the fail-safe flag #ETCFAIL_S and the relay ON request flag #RLYON_SQ (=1: on request exists) based on the motor relay diagnosis are performed of a NOT-AND operation by the NAND circuit 109. The result of the NOT-AND operation is set to the motor relay control flag #RLYON_S.

The clear condition flags (1) and (2) are set according to the logic operation as shown in FIG. 4(A) and FIG. 4(B).

FIG. 4(A) shows an operation circuit corresponding to a first clear condition operation device and a first clear condition operation means for operating the clear condition flag (1) of the main operation unit.

Failure determination flags #APSSNG and #TPSSNG, to which the results of fault diagnosis of the accelerator opening sensor for detecting the accelerator opening and the throttle opening sensor for detecting the throttle valve opening are set, are performed of an OR operation by an OR circuit 121.

The failure determination flags #APSSNG and #TPSSNG are set to 0 respectively when failure occurs to the accelerator opening sensor or the throttle opening sensor. When duplex accelerator opening sensors and duplex throttle position sensors are equipped, the flags are set to 0 only when both duplex sensors are malfunctioning.

An output from the OR circuit 121, together with an idle OFF flag #IDLEOFF that is set to 1 when the idle switch is off and a break OFF flag #BRKSWOFF which is set to 1 when a break switch is off, is performed of an AND operation by an AND circuit 122 (third AND circuit). When at least either the accelerator opening sensor or the throttle opening sensor is working normally, and both the idle switch and the break switch are turned off, 1 is output from the AND circuit 122.

The idle switch is a switch that is turned on when the throttle valve is fully closed, and the break switch is a switch that is turned on when the break is operated.

An AND operation is performed by an AND circuit 123 (fourth AND circuit) to an output from the AND circuit 122 and an idle experience flag #ETCFJUD (=1: idle experienced) which shows that the on state of the idle switch has been experienced. When 1 is output from the AND circuit 122, and when the on state of the idle switch has been experienced, 1 is set to the clear condition flag (1).

On the other hand, FIG. 4(B) shows an operation circuit corresponding to a second clear condition operation device and a second clear condition operation means for operating the clear condition flag (2) of the sub operation unit.

As shown, a NOT-AND operation of the failure determination flag #APSSNG, a failure determination flag #APSSNG_S which is a value obtained by inverting #TPSSNG, and #TPSSNG_S, is performed by a NAND circuit 131. Further, the result of the NOT-AND operation, an idle OFF flag #IDLE_OFF, and a break OFF flag #BRKSW_OFF are performed of a NOT-AND operation by a NAND circuit 132.

Similar to the idle OFF flag #IDLEOFF and the break OFF flag #BRKSWOFF, 1 is set to the idle OFF flag #IDLE_OFF or the break OFF flag #BRKSW_OFF when the idle switch is off or the break switch is off.

A NOT-OR operation is performed by a NOR circuit 133 (third NOR circuit) of the result of the above NOT-AND operation and a flag #ETCFJUD_S to which 0 is set when the idle state is experienced. The result of the NOT-OR operation is set to the clear condition flag (2).

Similar to the clear condition 1, the clear condition flag (2) is also set to 1 when the idle switch is off, the break switch is off, and the idle state is experienced, while the condition allows throttle control. However, the logic of the clear condition flag (2) is set to be reverse to the logic of the operation circuit of the clear condition flag (1). Therefore, even if the failure determination flags #APSSNG, #TPSSNG, #APSSNG_S and #TPSSNG_S are all forcibly set to 0 or 1, influenced by the failure of the word line or the bit line of the RAM, one of the clear condition flags (1) or (2) will not be fulfilled (=0). Accordingly, the present embodiment allows avoiding the situation caused by the RAM failure where the relay off request may not be executed.

What we claimed are:

1. A fail-safe apparatus of an electronic control system comprising:
   a fault diagnosis device for performing a fault diagnosis of a diagnosis object and setting a fault diagnosis flag denoting whether a fault exists or not;
   a first request flag operation device for operating a first fail-safe request flag denoting whether to request execution of fail-safe process or not, according to a logic operation based on said fault diagnosis flag;

a second request flag operation device for operating a second fail-safe request flag according to the logic operation based on said fault diagnosis flag, which performs an operation of a fail-safe request flag according to the logic reverse to the logic for the logic operation performed by said first request flag operation device; and a fail-safe control device for outputting a fail-safe control signal to a control object when at least one of said first and second fail-safe request flags denotes a request for executing fail-safe process.

2. The fail-safe apparatus of an electronic control system according to claim 1, wherein:

the request for executing fail-safe process is denoted when said first fail-safe request flag is set to 1; and the request for executing fail-safe process is denoted when said second fail-safe request flag is set to 0.

3. The fail-safe apparatus of an electronic control system according to claim 1, wherein:

the logic operations of said first and second request flag operation devices include a logic operation operating said first and second fail-safe request flags to a value denoting the request for executing fail-safe process, when at least one of the two fail-safe request flags, one flag being operated based on said fault diagnosis flag and the other flag being operated based on said fault diagnosis of the control object, denotes the request for executing fail-safe process.

4. The fail-safe apparatus of an electronic control system according to claim 1, wherein:

the logic operations of said first and second request flag operation devices include a logic operation cancelling the request for executing said fail-safe process according to said first and second fail-safe request flags, when clear conditions are fulfilled.

5. The fail-safe apparatus of an electronic control system according to claim 4, further comprising:

a first clear condition operation device for performing a logic operation of a clear condition flag denoting whether said clear conditions are fulfilled, and outputting the result to said first request flag operation device; and a second clear condition operation device for performing a logic operation of said clear condition flag and outputting the result to said second request flag operation device, which performs the logic operation of said clear condition flag according to the logic reverse to the logic for the logic operation performed by said first clear condition operation device.

6. The fail-safe apparatus of an electronic control system according to claim 1, wherein:

the logic operations of said first and second request flag operation devices include a logic operation operating said first and second fail-safe request flags to a value denoting the request for executing fail-safe process, when at least one of the two fail-safe request flags, one flag being operated based on said fault diagnosis flag and the other flag being operated based on said fault diagnosis flag, denotes the request for executing fail-safe process.

7. The fail-safe apparatus of an electronic control system according to claim 1, wherein:

said fault diagnosis device diagnoses a read/write error of a RAM as said diagnosis object.

8. The fail-safe apparatus of an electronic control system according to claim 7, wherein:

said RAM as said diagnosis object is a RAM utilized for controlling a motor in an engine having a throttle valve being driven to open/close by said motor.

9. The fail-safe apparatus of an electronic control system according to claim 8, wherein:

said fail-safe control device makes a relay of said motor to be said control object, and outputs a fail-safe control signal for turning the relay off forcibly when at least one of said first and second fail-safe request flags denotes a request for executing fail-safe process.

10. A fail-safe apparatus of an electronic control system comprising:

a fault diagnosis means for performing a fault diagnosis of a diagnosis object and setting a fault diagnosis flag denoting whether a fault exists or not;

a first request flag operation means for operating a first fail-safe request flag denoting whether to request execution of a fail-safe process or not, according to a logic operation based on said fault diagnosis flag;

a second request flag operation means for operating a second fail-safe request flag according to a logic operation based on said fault diagnosis flag, which performs an operation of a fail-safe request flag according to the logic reverse to the logic for the logic operation performed by said first request flag operation device; and a fail-safe control means for outputting a fail-safe control signal to a control object when at least one of said first and second fail-safe request flags denotes a request for executing said fail-safe process.

11. A fail-safe method of an electronic control system comprising the steps of:

performing a fault diagnosis of a diagnosis object;

operating a first fail-safe request flag that denotes a request for executing fail-safe process when the flag is set to 1, based on the result of said fault diagnosis;

operating a second fail-safe request flag that denotes a request for executing fail-safe process when the flag is set to 0, based on the result of said fault diagnosis; and executing said fail-safe process when at least one of said first and second fail-safe request flags denotes a request for executing the fail-safe process.

12. A fail-safe method of an electronic control system comprising the steps of:

operating a fault diagnosis flag denoting whether a fault exists in a diagnosis object;

operating a first fail-safe request flag denoting whether to request execution of fail-safe process or not, according to a logic operation based on said fault diagnosis flag;

operating a second fail-safe request flag based on said fault diagnosis flag, according to the logic reverse to the logic for the operation of said first fail-safe request flag; and outputting a fail-safe control signal to a control object when at least one of the first and second fail-safe request flags denotes a request for executing fail-safe process.

13. A fail-safe apparatus of an electronic control system comprising:

a diagnosis circuit for performing a fault diagnosis of a diagnosis object and operating diagnosis flags #FLGRTM and #FLGRTS, which denote that a fault has occurred when set to 1;

a first OR circuit for outputting a fail-safe request flag #ETCOFF according to an OR operation based on said diagnosis flags #FLGRTM and #FLGRTS;

a first NOR circuit for outputting a fail-safe request flag #ETCOFF_S according to a NOT-OR operation based on said diagnosis flags #FLGRTM and #FLGRTS;

a second NOR circuit for outputting a fail-safe request flag #RLYON according to a NOT-OR operation of said fail-safe request flag #ETCOFF and a fail-safe request flag #RLYOFFRQ, which is operated based on a fault diagnosis of a control object and which denotes a fail-safe request when set to 1;

a first NAND circuit for outputting a fail-safe request flag #RLYON_S according to a NOT-AND operation of said fail-safe request flag #ETCOFF_S and a fail-safe request flag #RLYON_SQ, which is operated based on said fault-diagnosis of the control object and which denotes a fail-safe request when set to 0; and a first AND circuit for outputting a fail-safe control signal to said control object according to an AND operation of said fail-safe request flag #RLYON and an inverted value of said fail-safe request flag #RLYON_S.

14. The fail-safe apparatus of an electronic control system according to claim 13, further comprising:

a second AND circuit for outputting to said second NOR circuit, instead of said fail-safe request flag #ETCOFF, an operation result obtained by performing an AND operation of said fail-safe request flag #ETCOFF and an inverted value of a clear condition flag (1), which is set to 1 when conditions for clearing said fail-safe request are fulfilled; and a second OR circuit for outputting to said first NAND circuit, instead of said fail-safe request flag #ETCOFF_S, an operation result obtained by performing an OR operation of said fail-safe request flag #ETCOFF_S and a clear condition flag (2), which is set to 1 when conditions for clearing said fail-safe request are fulfilled.

15. The fail-safe apparatus of an electronic control system according to claim 14, further comprising:

a third AND circuit for performing an AND operation of various clear condition flags which are set to 1 when said clear conditions are fulfilled;

a fourth AND circuit for performing an AND operation of an output from said third AND circuit and an experience flag #ETCFJUD denoting that a predetermined fail-safe state has been experienced when set to 1, and outputting the result of said operation as said clear condition flag (1);

a second NAND circuit for performing a NOT-AND operation of various clear condition flags which are set to 1 when said clear conditions are fulfilled; and a third NOR circuit for performing a NOT-OR operation of an output from said second NAND circuit and an experience flag #ETCFJUD_S denoting that a predetermined fail-safe state has been experienced when set to 0, and outputting the result of said operation as said clear condition flag (2).

* * * * *